(12) United States Patent
Momono et al.

(10) Patent No.: US 7,956,473 B2
(45) Date of Patent: Jun. 7, 2011

(54) SEMICONDUCTOR DEVICE

(75) Inventors: Hiroyuki Momono, Tokyo (JP); Hiroshi Mitsuyama, Tokyo (JP); Katsuhiro Hasegawa, Itami (JP); Keiko Nishitsuji, Itami (JP); Kazunobu Miki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 216 days.

(21) Appl. No.: 12/178,373

(22) Filed: Jul. 23, 2008

(65) Prior Publication Data

US 2009/0026635 A1 Jan. 29, 2009

(30) Foreign Application Priority Data

Jul. 23, 2007 (JP) ................................ 2007-191183

(51) Int. Cl.
*H01L 23/58* (2006.01)
*H01L 21/302* (2006.01)
*H01L 23/52* (2006.01)

(52) U.S. Cl. ......... 257/782; 257/E23.069; 257/E23.002; 257/E21.223; 257/781; 257/773; 257/774; 257/763; 257/764; 257/750; 257/751; 438/694; 438/618; 438/637

(58) Field of Classification Search .................. 257/782, 257/E21.223, E23.002, 700, 701, 758, 774, 257/750, 751, 763, 764, E23.069, E23.02, 257/E23.179, 773, 781; 438/694, 618, 637
See application file for complete search history.

(56) References Cited

U.S. PATENT DOCUMENTS

| | | | | |
|---|---|---|---|---|
| 5,430,329 A * | 7/1995 | Harada et al. | ................ | 257/786 |
| 6,031,257 A * | 2/2000 | Noto et al. | ................ | 257/202 |
| 6,143,644 A * | 11/2000 | Chen et al. | ................ | 438/622 |
| 6,559,548 B1 * | 5/2003 | Matsunaga et al. | ........... | 257/774 |
| 6,596,622 B2 * | 7/2003 | Okada | ........................ | 438/617 |
| 6,696,357 B2 * | 2/2004 | Imai et al. | ................ | 438/612 |
| 6,747,355 B2 * | 6/2004 | Abiru et al. | ................ | 257/758 |
| 6,881,597 B2 * | 4/2005 | Asayama et al. | ............ | 438/18 |
| 7,056,820 B2 * | 6/2006 | Cole et al. | ................ | 438/618 |
| 7,217,965 B2 * | 5/2007 | Fujiki et al. | ................ | 257/209 |
| 7,253,519 B2 * | 8/2007 | Huang et al. | ................ | 257/738 |
| 7,550,376 B2 * | 6/2009 | Watanabe | ................ | 438/622 |
| 7,622,364 B2 * | 11/2009 | Adkisson et al. | ........... | 438/462 |
| 7,679,187 B2 * | 3/2010 | Wang et al. | ................ | 257/734 |

(Continued)

FOREIGN PATENT DOCUMENTS

| | | |
|---|---|---|
| JP | 60-4248 | 1/1985 |
| JP | 02-63127 | 3/1990 |
| JP | 05-29375 | 2/1993 |
| JP | 2000-183104 | 6/2000 |

(Continued)

*Primary Examiner* — Alexander O Williams
(74) *Attorney, Agent, or Firm* — McDermott Will & Emery LLP (57) ABSTRACT

Method of manufacturing semiconductor device including forming inter-layer insulating film on semiconductor substrate. First metal film is formed on inter-layer insulating film. First resist is formed on first metal film and patterned. Anisotropic etching performed on first metal film using first resist as mask. First resist is removed and second metal film is formed on inter-layer insulating film to cover remaining first metal film. Second resist is formed on second metal film in area where first metal film exists on inter-layer insulating film and part of area where first metal film does not exist. Anisotropic etching is performed on second metal film using second resist as mask and bonding pad having first metal film and second metal film, and upper layer wiring having second metal film and not first metal film. Second resist is removed. Surface protection film covering bonding pad is formed. Pad opening is formed on bonding pad.

30 Claims, 11 Drawing Sheets

U.S. PATENT DOCUMENTS

| | | |
|---|---|---|
| 7,741,714 B2 * | 6/2010 | Huang et al. .................. 257/754 |
| 2003/0015799 A1 * | 1/2003 | Abiru et al. .................... 257/758 |
| 2003/0034567 A1 * | 2/2003 | Sato et al. ...................... 257/786 |
| 2006/0226547 A1 * | 10/2006 | Wang et al. .................... 257/758 |
| 2006/0267222 A1 * | 11/2006 | Saito ............................. 257/786 |
| 2007/0108489 A1 * | 5/2007 | Nagai ........................... 257/295 |
| 2007/0205508 A1 * | 9/2007 | Hsia et al. ..................... 257/734 |
| 2010/0155960 A1 * | 6/2010 | Kanzaki et al. ............... 257/773 |

FOREIGN PATENT DOCUMENTS

| | | |
|---|---|---|
| JP | 2002-208610 | 7/2002 |
| JP | 2003-282627 | 10/2003 |
| JP | 2003-324122 | 11/2003 |
| JP | 2005-19493 | 1/2005 |
| JP | 2005-109491 | 4/2005 |
| JP | 2005-223123 | 8/2005 |
| JP | 2005-243907 | 9/2005 |

* cited by examiner

CONVENTIONAL ART

FIG. 23

CONVENTIONAL ART

SEMICONDUCTOR DEVICE

BACKGROUND OF THE INVENTION

1. Field of the Invention

The present invention relates to a semiconductor device having a bonding pad and a manufacturing method thereof, and more particularly, to a semiconductor device and a manufacturing method thereof, capable of preventing cracking from occurring in an inter-layer insulating film below a bonding pad and making finer an upper layer wiring formed in the same layer as the bonding pad.

2. Background Art

Semiconductor devices are provided with a bonding pad to exchange data with outside and apply a supply voltage or grounding voltage. When a semiconductor device is tested with a probe contacting this bonding pad or a wire is bonded to the bonding pad, there is a problem that an impact thereof causes a crack in an inter-layer insulating film below the bonding pad. Various semiconductor devices are proposed to solve this problem.

Figure 22:
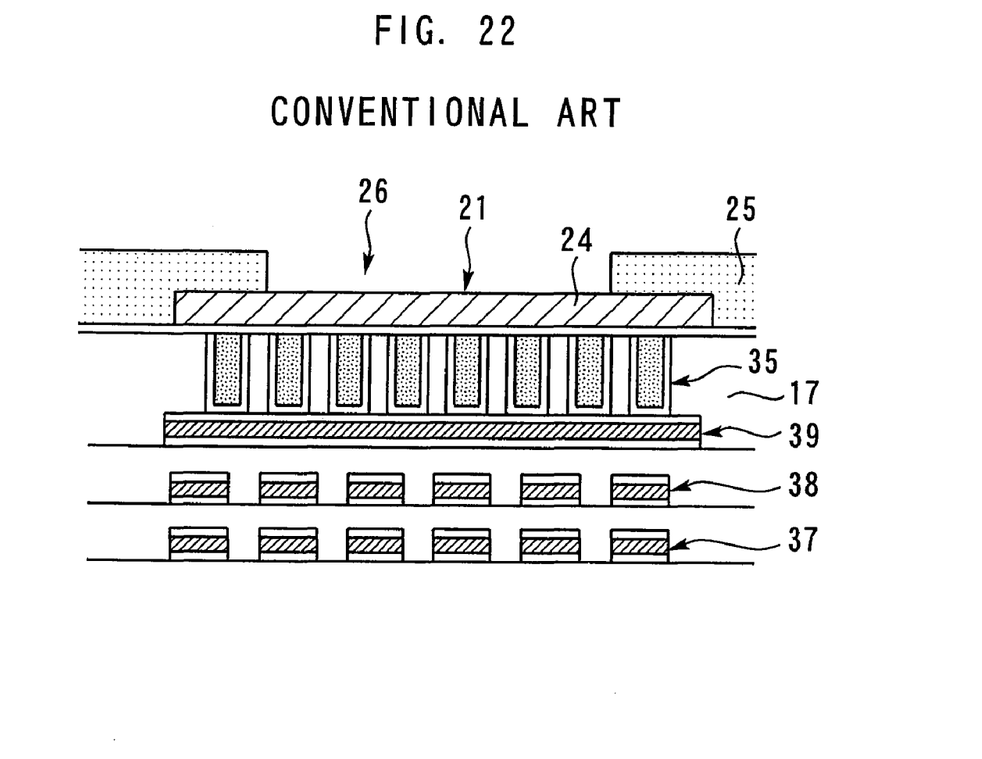
FIG. 22 is a cross-sectional view showing an example of a conventional semiconductor device.

FIG. 22 is a cross-sectional view showing an example of a conventional semiconductor device. A plurality of metal plugs 35 are formed below a bonding pad 21. There is a metal layer 39 connected below the metal plugs 35, and metal layers 37 and 38 divided into a plurality of portions are formed below the metal layer 39. The plurality of metal plugs 35 can increase average Young's modulus of an inter-layer insulating film 17 below the bonding pad 21. Furthermore, the metal layers 37 to 39 display a buffering effect. This can improve resistance to impacts of probing and wire bonding (e.g., see Japanese Patent Laid-open No. 2005-243907, Japanese Patent Laid-open No. 2003-282627 and Japanese Patent Laid-open No. 2002-208610).

Figure 23:
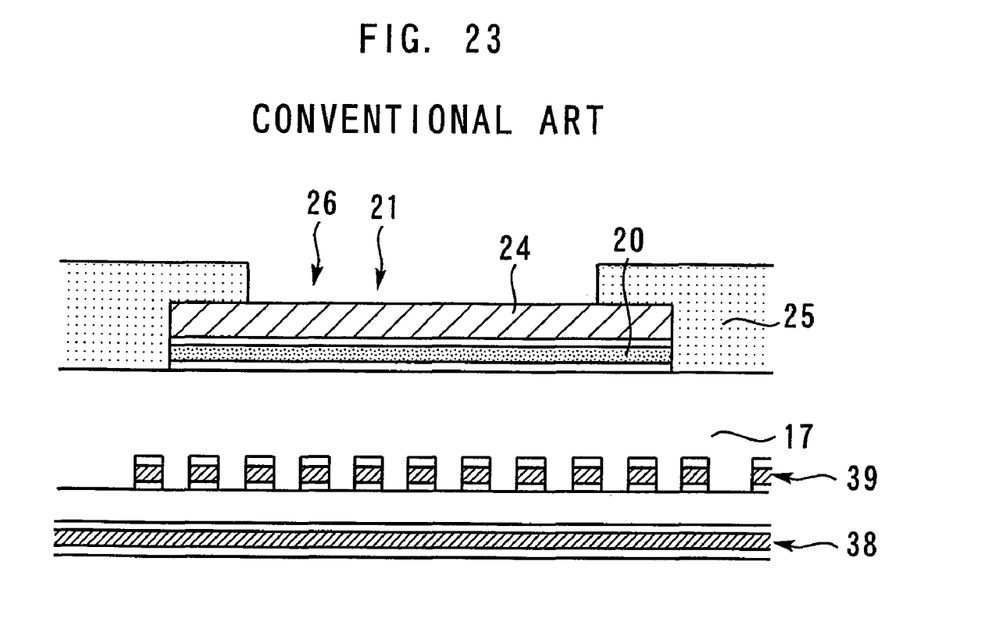
FIG. 23 is a cross-sectional view showing another example of the conventional semiconductor device.

FIG. 23 is a cross-sectional view showing another example of the conventional semiconductor device. A bonding pad 21 has a first metal film 20 having high Young's modulus and a second metal film 24 having lower Young's modulus than the first metal film 20 formed on this first metal film 20. Forming the first metal film 20 having high Young's modulus over the entire surface of the area in which a pad opening 26 of a surface protection film 25 as the lower layer of the bonding pad 21 in this way can further improve resistance (e.g., see Japanese Patent Laid-open No. 2000-183104, Japanese Patent Laid-open No. 2003-324122 and Japanese Patent Laid-open No. 2005-223123).

SUMMARY OF THE INVENTION

The semiconductor device in FIG. 22 is mass-produced in a 150 nm Al SOC process. However, when this semiconductor device is applied to a 130 nm Al SOC process, a thinned inter-layer insulating film 17 caused by a reduction in thickness of the device causes resistance to impacts of probing and wire bonding to fall below a mass production specification, producing cracking in an inter-layer film between the metal film 39 and metal film 38 and an inter-layer film between the metal film 38 and metal film 37 below the bonding pad 21.

On the other hand, the semiconductor device in FIG. 23 has resistance which satisfies the mass production specification even when applied to the 130 nm Al SOC process and can prevent cracking from occurring in an inter-layer film between a metal film 39 and metal film 38 below a bonding pad 21 and even in an inter-layer insulating film 17. However, since an upper layer wiring formed in the same layer as the bonding pad 21 is formed simultaneously with the bonding pad 21, the upper layer wiring has a two-layer structure of the first metal film 20 and second metal film 24. Here, since a resist needs to be thick when etching the first metal film 20 having high Young's modulus, fine patterning cannot be realized for the first metal film 20. Therefore, there is a problem that it is not possible to miniaturize the upper layer wiring of a normal circuit section such as a core circuit and data wiring section.

The present invention has been implemented to solve the above described problems and it is an object of the present invention to provide a semiconductor device and a manufacturing method thereof capable of preventing cracking from occurring in an inter-layer insulating film below a bonding pad and making finer an upper layer wiring formed in the same layer as the bonding pad.

According to one aspect of the present invention, a method of manufacturing a semiconductor device comprises: a step of forming an inter-layer insulating film on a semiconductor substrate; a step of forming a first metal film on the inter-layer insulating film; a step of forming a first resist on the first metal film and patterning the first resist; a step of performing anisotropic etching on the first metal film using the first resist as a mask; a step of removing the first resist; a step of forming a second metal film on the inter-layer insulating film so as to cover the remaining first metal film; a step of forming a second resist on the second metal film in an area where the first metal film exists on the inter-layer insulating film and part of an area where the first metal film does not exist; a step of performing anisotropic etching on the second metal film using the second resist as a mask and forming a bonding pad having the first metal film and the second metal film and an upper layer wiring which has the second metal film, yet not the first metal film; a step of removing the second resist; a step of forming a surface protection film so as to cover the bonding pad; and a step of forming a pad opening in the surface protection film on the bonding pad.

According to this embodiment, it is possible to prevent cracking from occurring in the inter-layer insulating film below the bonding pad and making finer the upper layer wiring formed in the same layer as the bonding pad.

Other and further objects, features and advantages of the invention will appear more fully from the following description.

DETAILED DESCRIPTION OF THE PREFERRED EMBODIMENTS

First Embodiment

Figure 1:
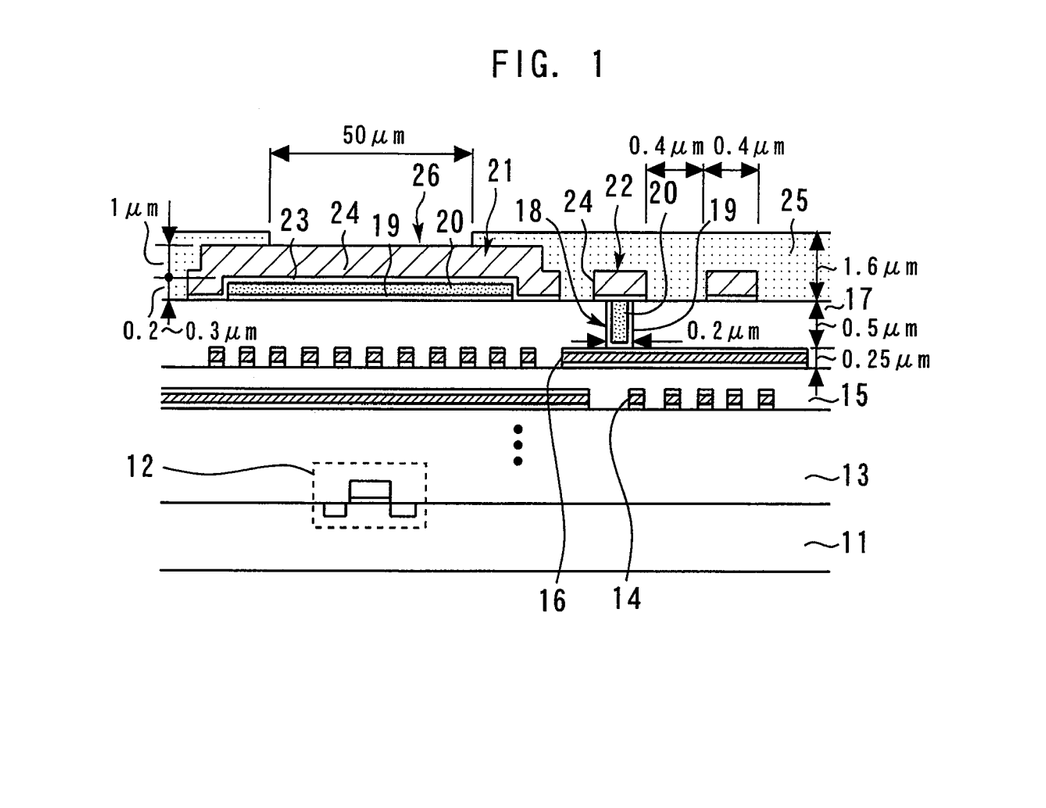
FIG. 1 is a cross-sectional view showing a semiconductor device according to a first embodiment of the present invention.
Figure 2:
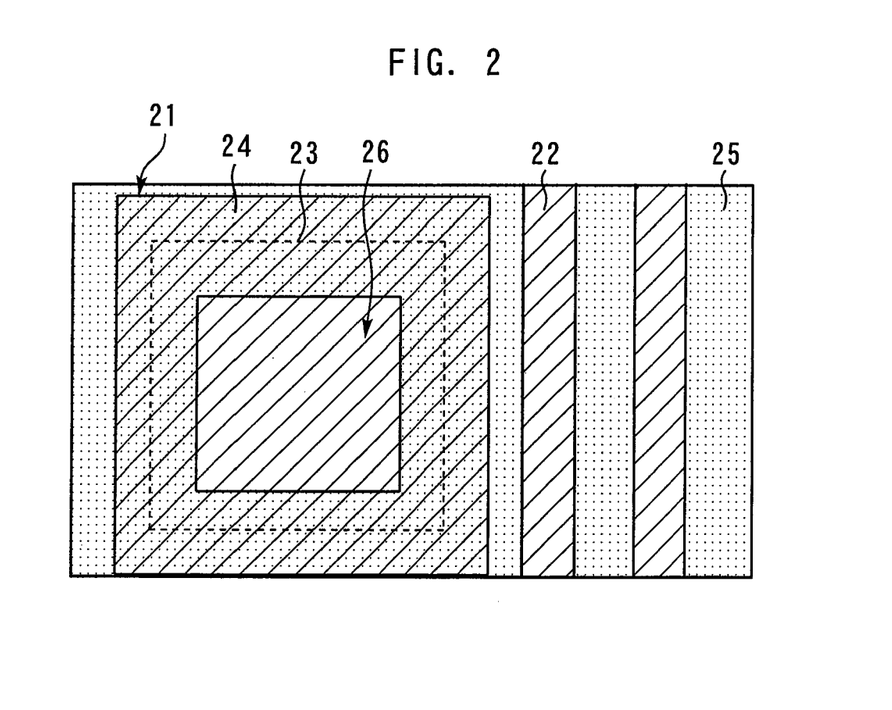
FIG. 2 is a top view showing a semiconductor device according to a first embodiment of the present invention.

FIG. 1 is a cross-sectional view showing a semiconductor device according to a first embodiment of the present invention and FIG. 2 is a top view thereof.

An active element 12 such as a transistor is formed on a semiconductor substrate 11. An inter-layer insulating film 13 is formed on the semiconductor substrate 11 so as to cover this active element 12. A lower layer wiring 14 is formed on this inter-layer insulating film 13. An inter-layer insulating film 15 is formed so as to cover a lower layer wiring 14. A lower layer wiring 16 is formed on this inter-layer insulating film 15. The lower layer wirings 14 and 16 are made of an Al film, on and below which a TiN barrier metal is formed.

An inter-layer insulating film 17 is formed so as to cover the lower layer wiring 16. A contact plug 18 connected to part of the lower layer wiring 16 is formed in this inter-layer insulating film 17. The contact plug 18 has a TiN barrier metal 19 and a first metal film 20.

Here, W, Ti, TiN, Ta or the like, which is metal having high Young's modulus is used as the first metal film 20. Furthermore, a low dielectric constant film is used as the inter-layer insulating films 13, 15 and 17. Here, a porous SiOC film is used as the low dielectric constant films. This porous SiOC film is methyl-containing polysiloxane whose major constituent is Si—$CH_3$ group and is porous because the existence of $CH_3$ produces pores in the molecular structure and causes the dielectric constant to decrease. However, the low dielectric constant film is not limited to this and, for example, an SiOCH-based porous low dielectric constant film, porous silica-based material such as Nano Clustering Silica film or H-containing polysiloxane called "porous HSQ," organic polymer film or organic polymer porous film or the like can be used as the low dielectric constant film as appropriate.

A bonding pad 21 is formed on the inter-layer insulating film 17. Furthermore, an upper layer wiring 22 is formed on the inter-layer insulating film 17 in the same layer as the bonding pad 21. The bonding pad 21 has the TiN barrier metal 19 and first metal film 20, and a TiN barrier metal 23 and second metal film 24 formed on this first metal film 20. On the other hand, the upper layer wiring 22 has a second metal film 24, yet not the first metal film 20. Here, a metal having lower Young's modulus than the first metal film 20 such as Al—Cu, Al—Si—Cu or Cu is used as the second metal film 24.

A surface protection film 25 is formed so as to cover the bonding pad. In this surface protection film 25, a pad opening 26 having a smaller width than that of the first metal film 20 of the bonding pad 21 is formed on the bonding pad 21.

The film thickness of the lower layer wiring 16 is 0.25 µm. The contact plug 18 has a width of 0.2 µm and a depth of 0.5 µm. The film thickness of the first metal film 20 is 0.2 to 0.3 µm and the film thickness of the second metal film 24 is 1 µm. The width of the upper layer wiring 22 is 0.4 µm and the distance between the upper layer wirings 22 is 0.4 µm. The film thickness of the surface protection film 25 is 1.6 µm and the width of the pad opening 26 is 50 µm.

Next, the method of manufacturing the semiconductor device according to the first embodiment of the present invention having the above described configuration will be explained with reference to the accompanying drawings.

Figure 3:
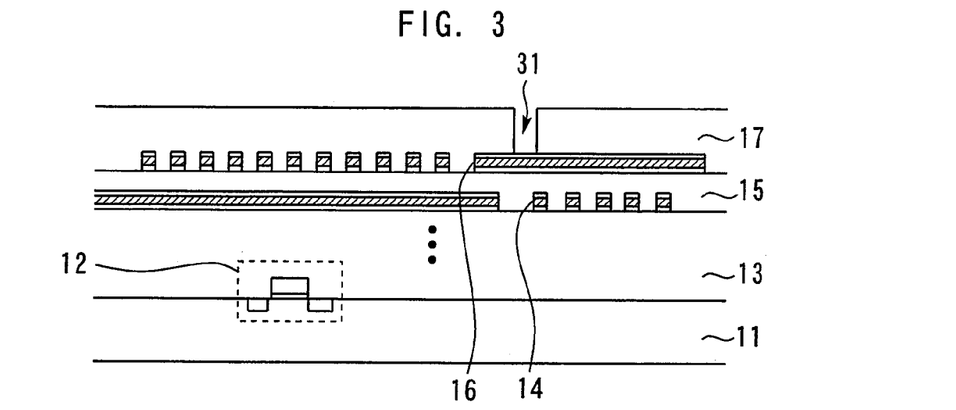
FIGS. 3-9 are sectional views for explaining a method of manufacturing a semiconductor device according to a first embodiment of the present invention.

First, as shown in FIG. 3, the active element 12, inter-layer insulating film 13, lower layer wiring 14, inter-layer insulating film 15 and lower layer wiring 16 are formed on the semiconductor substrate 11 using a normal technique. Next, the inter-layer insulating film 17 is formed on the semiconductor substrate 11 so as to cover the lower layer wiring 16. A first contact hole 31 is then formed in the inter-layer insulating film 17 to expose part of the lower layer wiring 16.

Figure 4:
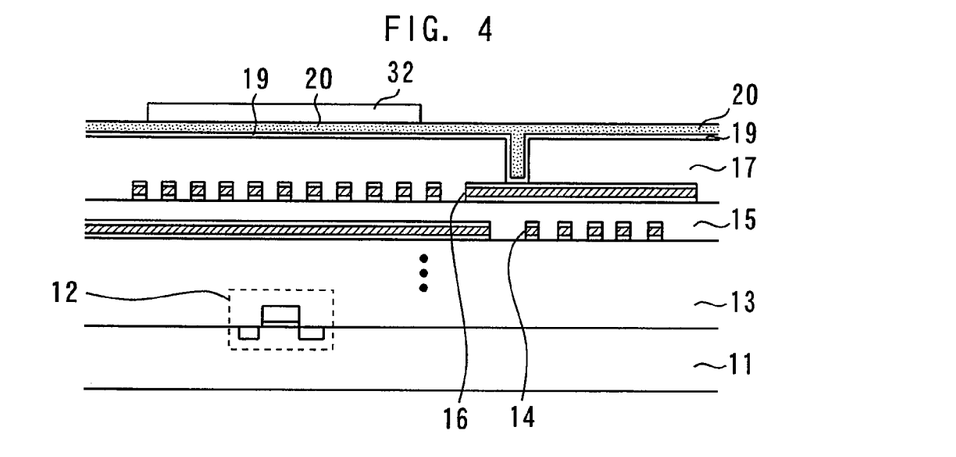

Next, as shown in FIG. 4, the TiN barrier metal 19 is formed on the inter-layer insulating film 17 and in the first contact hole 31 and then the first metal film 20 is formed in the inter-layer insulating film 17 and first contact hole 31 through the TiN barrier metal 19. A first resist 32 is formed on the first metal film 20, the first resist 32 is patterned and the first resist 32 is removed from an area where at least the first contact hole 31 exists and in the periphery thereof.

Figure 5:
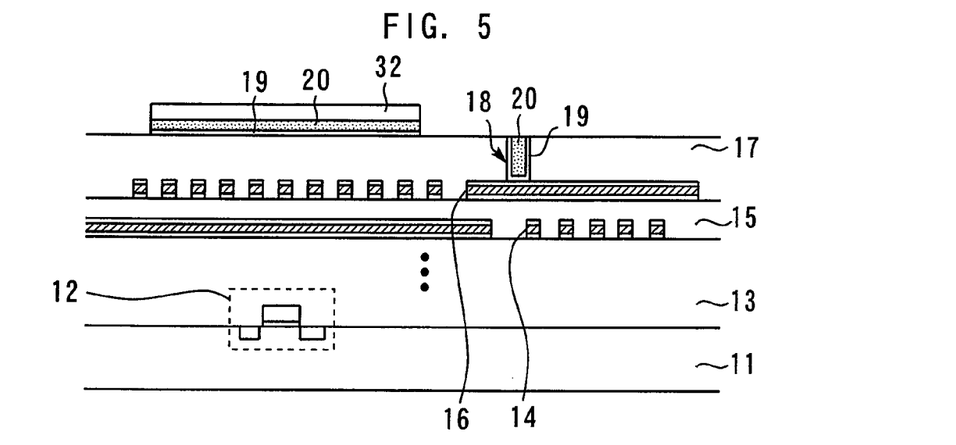

Next, as shown in FIG. 5, the first metal film 20 and TiN barrier metal 19 are subjected to anisotropic etching (dry etching) using the first resist 32 as a mask and the first metal film 20 and TiN barrier metal 19 on the inter-layer insulating film 17 in the periphery of the first contact hole 31 are removed. However, the first metal film 20 and TiN barrier metal 19 in the first contact hole 31 are left as they are. The first resist 32 is then removed.

Figure 6:
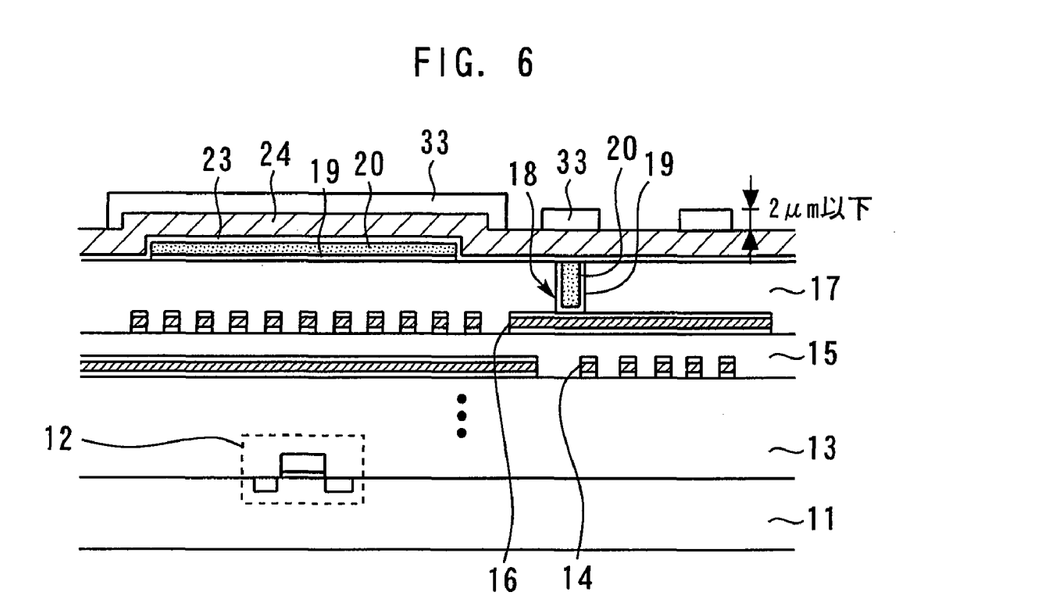

Next, as shown in FIG. 6, the TiN barrier metal 23 and the second metal film 24 having lower Young's modulus than first metal film 20 are formed stacked on the inter-layer insulating film 17 so as to cover the remaining first metal film 20. A second resist 33 is formed on the second metal film 24 in an area where the first metal film 20 exists on the inter-layer insulating film 17 and in an area where the first contact hole 31 exists which is part of the area where the first metal film 20 does not exist. Here, the film thickness of the second resist 33 is set to 2 µm or less. Furthermore, the width of the second resist 33 formed on the first metal film 20 which exists on the inter-layer insulating film 17 is made greater than that of the first metal film 20.

Figure 7:
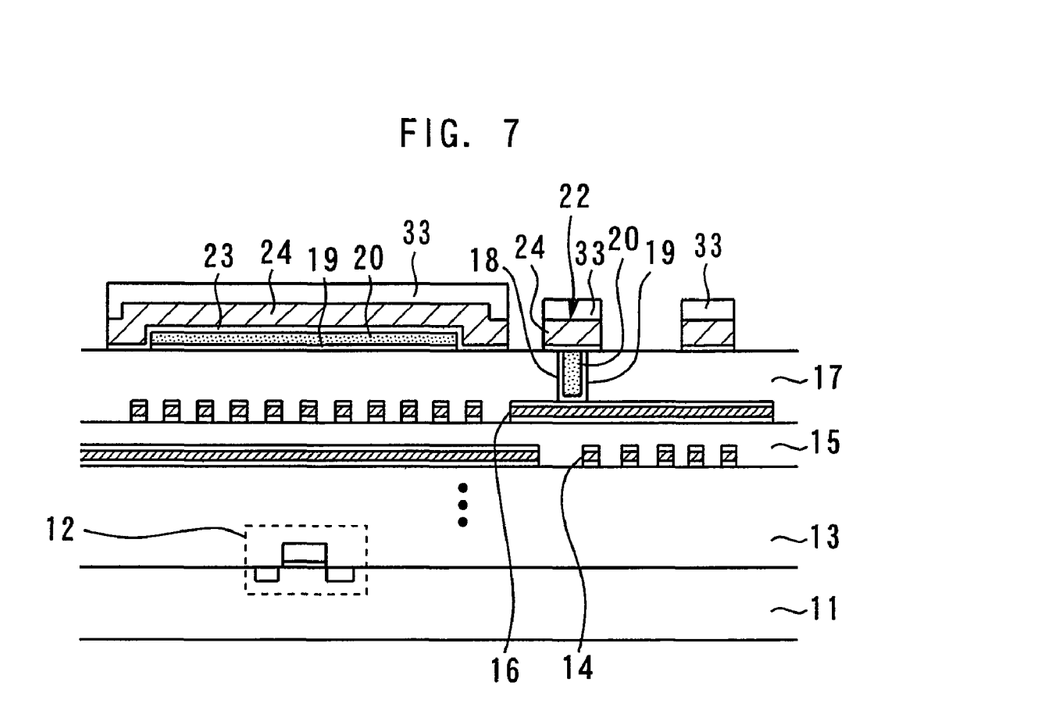

Next, as shown in FIG. 7, the second metal film 24 and TiN barrier metal 23 are subjected to anisotropic etching (dry etching) using the second resist 33 as a mask to form the bonding pad 21 having at least the first metal film 20 and second metal film 24, and the upper layer wiring 22 that has at least the second metal film 24, yet not the first metal film 20. The second resist 33 is then removed.

Figure 8:
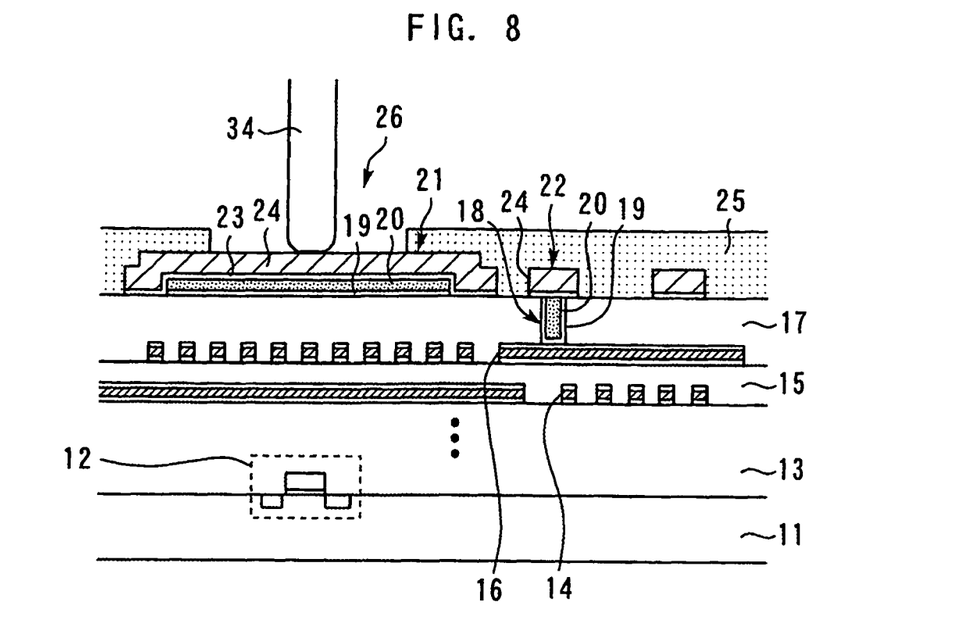

Next, as shown in FIG. 8, the surface protection film 25 is formed so as to cover the bonding pad 21. On the bonding pad 21, the pad opening 26 having a smaller width than that of the first metal film 20 of the bonding pad 21 is formed in the surface protection film 25. The semiconductor device according to this embodiment is formed in the above described processes.

Figure 9:
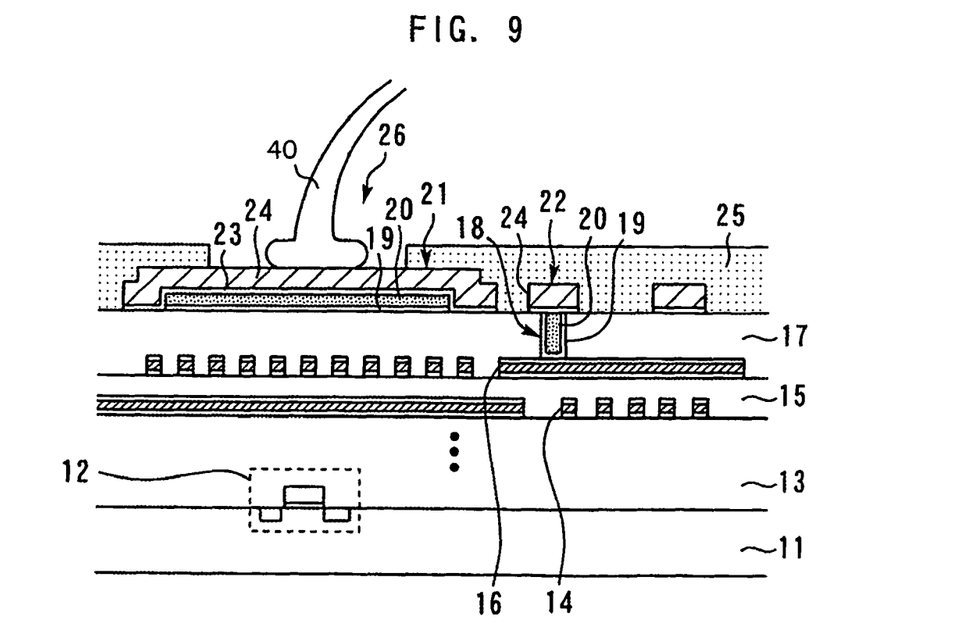

The semiconductor device is then tested with a probe 34 contacting the bonding pad 21. Furthermore, as shown in FIG. 9, an Au wiring 40 is bonded to the bonding pad 21.

As described above, this embodiment provides the first metal film 20 having high Young's modulus as the lower layer of the bonding pad 21, and can thereby improve resistance to impacts of probing and wire bonding. The first metal film 20 of the bonding pad 21 is formed over the entire surface of the area where the pad opening 26 of the surface protection film 25 is formed. This can further improve the resistance. Therefore, this embodiment can prevent cracking from occurring in the inter-layer insulating films 13 and 15 below the bonding pad 21 and moreover and even in the inter-layer insulating film 17, and can thereby realize a semiconductor device with high reliability. Furthermore, when low dielectric constant films are used as the inter-layer insulating films 13, 15 and 17, the problem of cracking in the inter-layer insulating films becomes serious, and therefore this embodiment is further effective. Moreover, since the active element 12 can be formed below the bonding pad 21, the size of the device can be reduced.

Furthermore, since the second metal film 24 having low Young's modulus is provided as the upper layer of the bonding pad 21, a wire bonding property is provided and damages to the probe can be avoided.

Furthermore, since the second metal film 24 has low Young's modulus, the film thickness of the second resist 33 can be reduced when patterning is performed (e.g., 2 µm or less). Therefore, fine patterning can be realized for the second metal film 24. In this embodiment, the upper layer wiring 22 has the second metal film 24, yet not first metal film 20. This allows the upper layer wiring 22 formed in the same layer as the bonding pad 21 to be miniaturized.

Furthermore, when the first metal film 20 of the bonding pad 21 is formed on the inter-layer insulating film 17, by embedding the first metal film 20 in the first contact hole 31 and forming the contact plug 18, it is possible to shorten the process and reduce cost.

Furthermore, making the width of the second metal film 24 of the bonding pad 21 equivalent to that of the first metal film 20 of the bonding pad 21 as in the conventional case prevents the film thickness of the second metal film 24 at an end of the first metal film 20 of the bonding pad 21 from increasing, which reduces processability when the second metal film 24 is etched. Moreover, this also involves a problem that a small side wall of the second metal film 24 is formed on the side wall of the first metal film 20 of the bonding pad 21, which then turns into dust and scatters. Therefore, this embodiment makes the width of the second metal film 24 of the bonding pad 21 greater than that of the first metal film 20 of the bonding pad 21 by at least the film thickness of the first metal film 20. This can improve processability and prevent dust from scattering.

Alternatively, the difference in width between the second metal film 24 of the bonding pad 21 and the first metal film 20 of the bonding pad 21 may also be set to at least the simple sum or sum of squares of a width variation of the first metal film 20, width variation of the second metal film 24 and variation in superimposition between the first metal film 20 and second metal film 24. Here, the width variation of the first metal film 20, width variation of the second metal film 24 and variation in superimposition between the first metal film 20 and second metal film 24 are obtained, for example, from an in-line evaluation. More specifically, suppose that based on individual evaluations of a plurality of already manufactured semiconductor devices such as previous-generation products, the width variations of the first metal film 20 (e.g., n variations of $\Delta 11, \Delta 12, \ldots \Delta 1n$), width variations of the second metal film 24 (n variations of $\Delta 21, \Delta 22, \ldots \Delta 2n$) and variation in superimposition between the first metal film 20 and second metal film 24 (e.g., n variations of $\Delta 31, \Delta 32 \ldots, \Delta 3n$) are obtained. The simple sum thereof is ($\Delta 11+\Delta 12+ \ldots \Delta 1n+\Delta 21+\Delta 22+ \ldots +\Delta 2n+\Delta 31+\Delta 32+ \ldots +\Delta 3n$). The sum of squares is $\sqrt{((\Delta 11)^2+(\Delta 12)^2+ \ldots +(\Delta 1n)^2+(\Delta 21)^2+(\Delta 22)^2+ \ldots +(\Delta 2n)^2+(\Delta 31)^2+(\Delta 32)^2+ \ldots +(\Delta 3n)^2)}$.

Furthermore, making the pad opening 26 of the surface protection film 25 narrower than the first metal film 20 of the bonding pad 21 can eliminate the gaps between the side of the bonding pad 21 and the surface protection film 25, secure flatness of the pad surface and thereby prevent damages to the probe or nonconformities of the wire bonding. More specifically, the difference in width between the pad opening 26 and the first metal film 20 is set to at least the simple sum or sum of squares of the width variations of the pad opening, width variations of the first metal film 20 and variation in superimposition between the pad opening and first metal film 20. The respective variations can be obtained through an in-line evaluation as described above.

Second Embodiment

Figure 10:
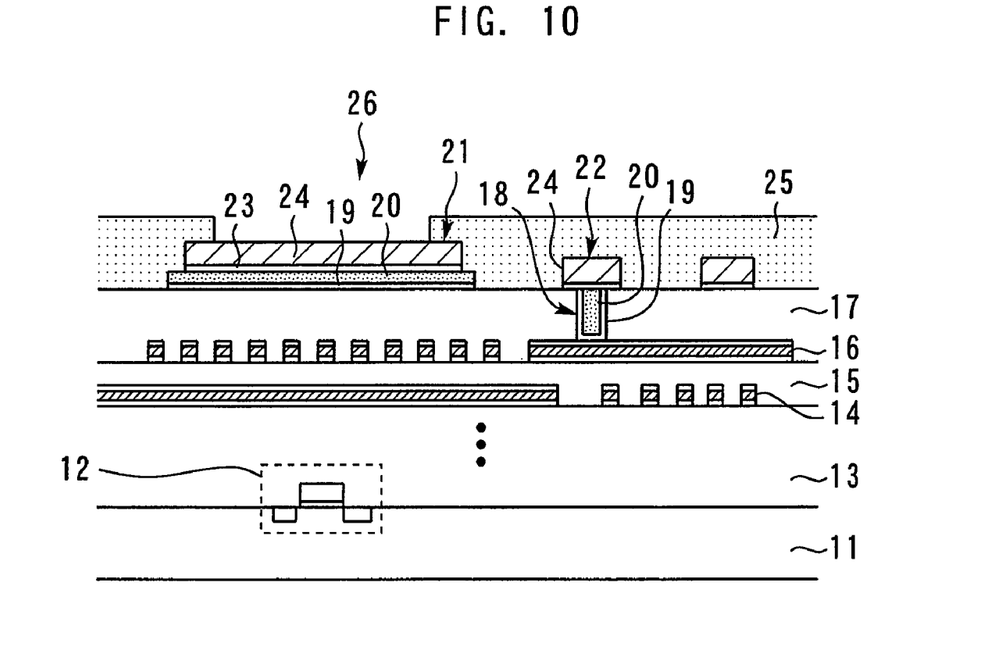
FIG. 10 is a cross-sectional view showing a semiconductor device according to a second embodiment of the present invention.
Figure 11:
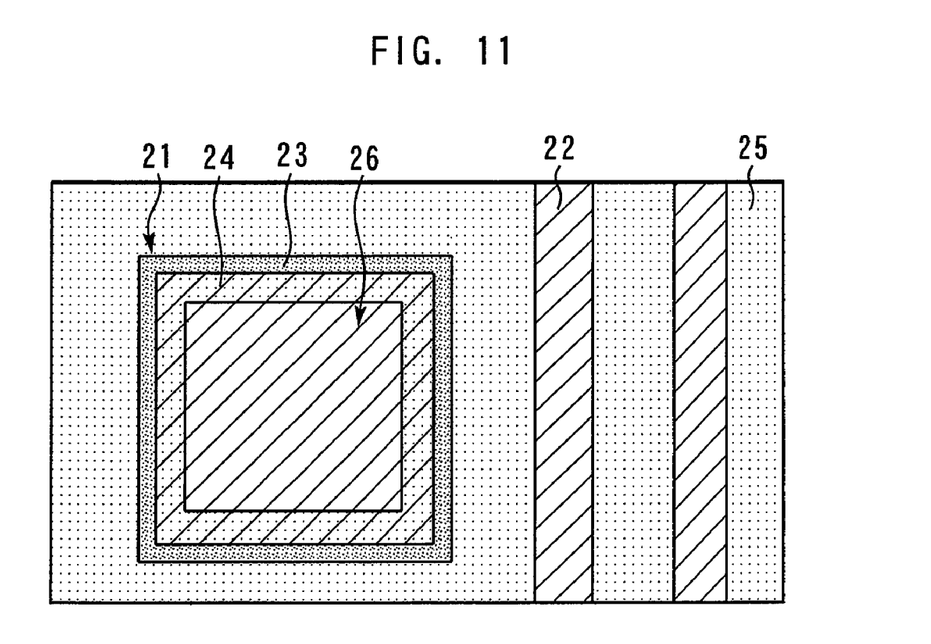
FIG. 11 is a top view showing a semiconductor device according to a second embodiment of the present invention.

FIG. 10 is a cross-sectional view showing a semiconductor device according to a second embodiment of the present invention and FIG. 11 is a top view thereof. The width of a second metal film 24 of a bonding pad 21 is smaller than that of a first metal film 20 of the bonding pad 21. The width of a pad opening 26 of a surface protection film 25 is smaller than that of the second metal film 24 of the bonding pad 21. The rest of the configuration is the same as that of first embodiment.

Next, the method of manufacturing the semiconductor device according to the second embodiment of the present invention having the above described configuration will be explained with reference to the accompanying drawings.

Figure 12:
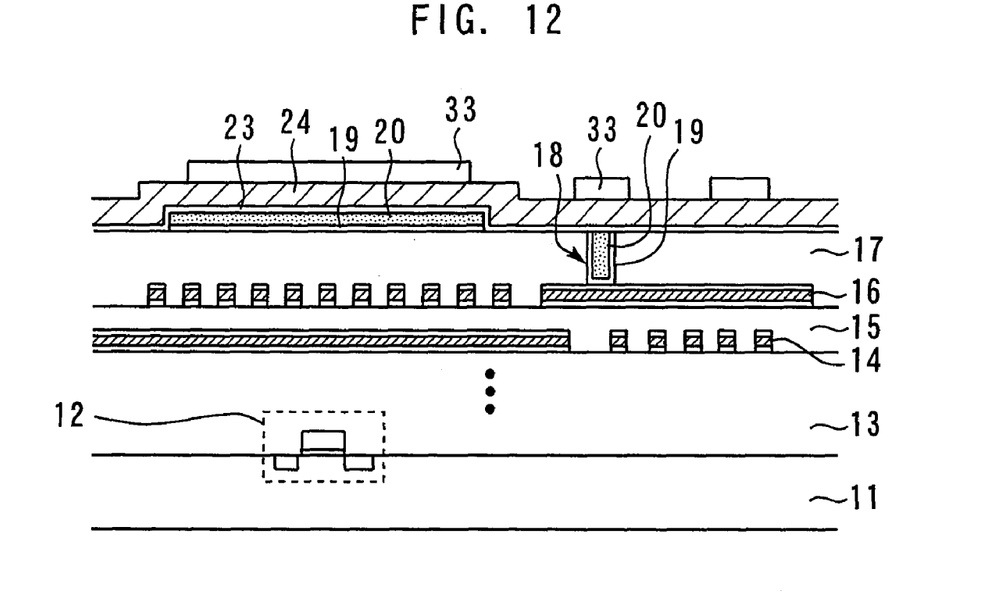
FIGS. 12-13 are sectional views for explaining a method of manufacturing a semiconductor device according to a second embodiment of the present invention.

First, processes in FIG. 3 to FIG. 5 will be executed as in the case of first embodiment. Next, as shown in FIG. 12, the second metal film 24 having lower Young's modulus than the first metal film 20 is formed on the inter-layer insulating film 17 so as to cover the remaining first metal film 20. The second resist 33 is formed on the second metal film 24 in the area where the first metal film 20 exists on the inter-layer insulating film 17 and the area where a first contact hole 31 exists which is part of the area where the first metal film 20 does not exist. Here, the width of the second resist 33 formed on the first metal film 20 which exists on the inter-layer insulating film 17 is made smaller than that of the first metal film 20.

Figure 13:
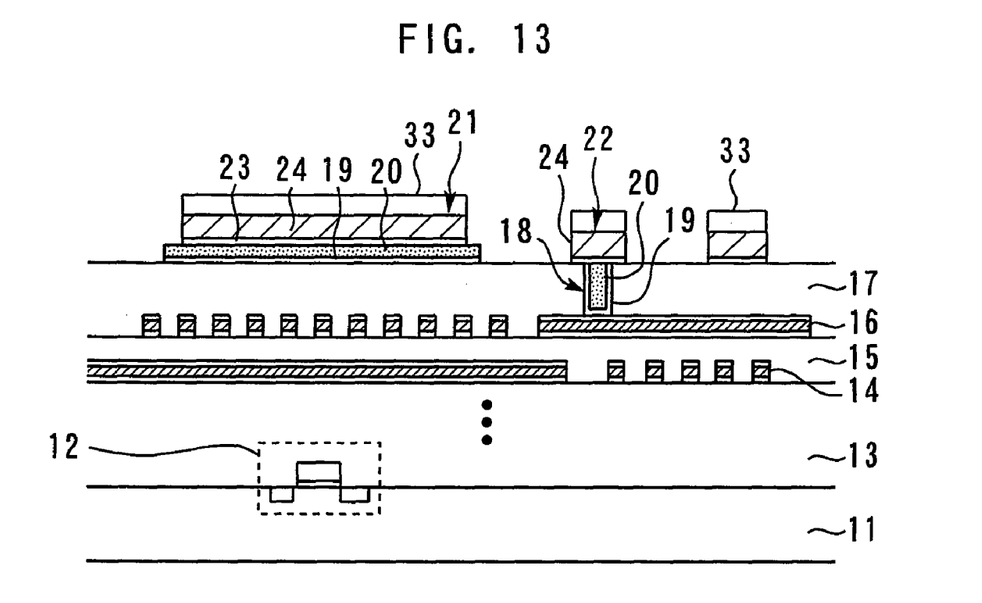

Next, as shown in FIG. 13, the second metal film 24 is subjected to anisotropic etching (dry etching) using the second resist 33 as a mask to form the bonding pad 21 having the first metal film 20 and second metal film 24, and the upper layer wiring 22 which has the second metal film 24, yet not the first metal film 20. The second resist 33 is then removed.

Next, the surface protection film 25 is formed so as to cover the bonding pad 21. On the bonding pad 21, the pad opening 26 having a smaller width than that of the second metal film 24 of the bonding pad 21 is formed in the surface protection film 25. The semiconductor device according to this embodiment is formed in the above described processes.

According to this second embodiment, the width of the second metal film 24 of the bonding pad 21 is smaller than that of the first metal film 20 of the bonding pad 21. This causes impacts of probing and wire bonding applied to the second metal film 24 to distribute over the entire surface of the pad, and can thereby further improve resistance to those impacts.

Furthermore, making the pad opening 26 of the surface protection film 25 narrower than the second metal film 24 of the bonding pad 21 can eliminate the gaps between the side of the bonding pad 21 and the surface protection film 25, secure flatness of the pad surface and thereby prevent damages to the probe and nonconformities of wire bonding.

Third Embodiment

Figure 14:
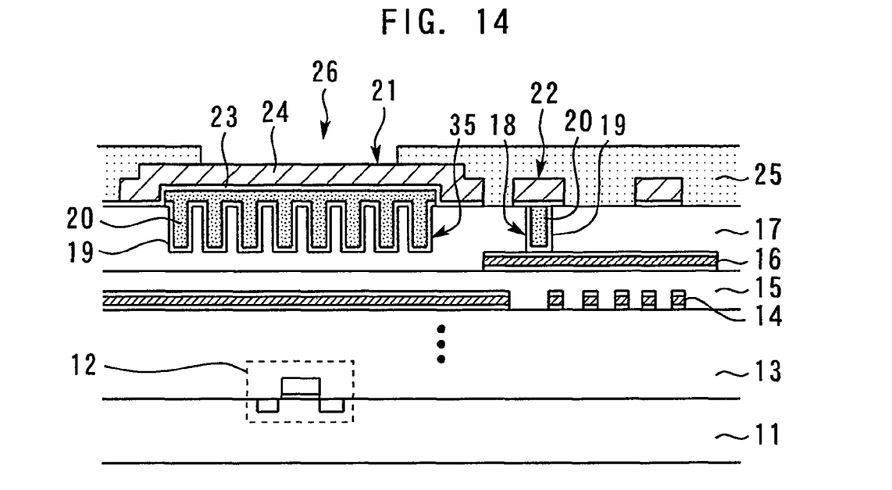
FIG. 14 is a cross-sectional view showing a semiconductor device according to a third embodiment of the present invention.
Figure 15:
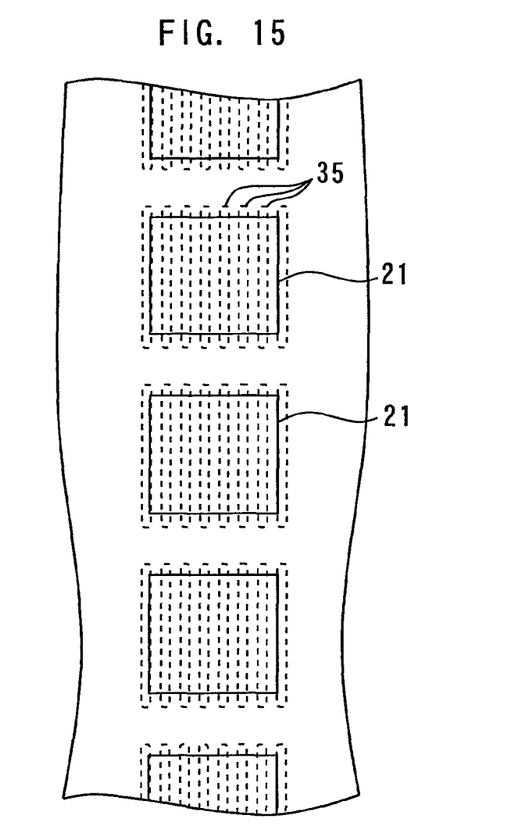
FIG. 15 is a top view showing a semiconductor device according to a third embodiment of the present invention.

FIG. 14 is a cross-sectional view showing a semiconductor device according to a third embodiment of the present invention and FIG. 15 is a top view thereof. A plurality of metal plugs 35 are formed below a bonding pad 21. Furthermore, a plurality of bonding pads 21 are arrayed in one direction within a plane. The shape of each metal plug 35 is linear whose longitudinal direction corresponds to the direction in which the plurality of bonding pads 21 are arrayed. The rest of the configuration is the same as that of the first or second embodiment.

Next, the method of manufacturing the semiconductor device according to the third embodiment of the present invention having the above described configuration will be explained with reference to the accompanying drawings.

Figure 16:
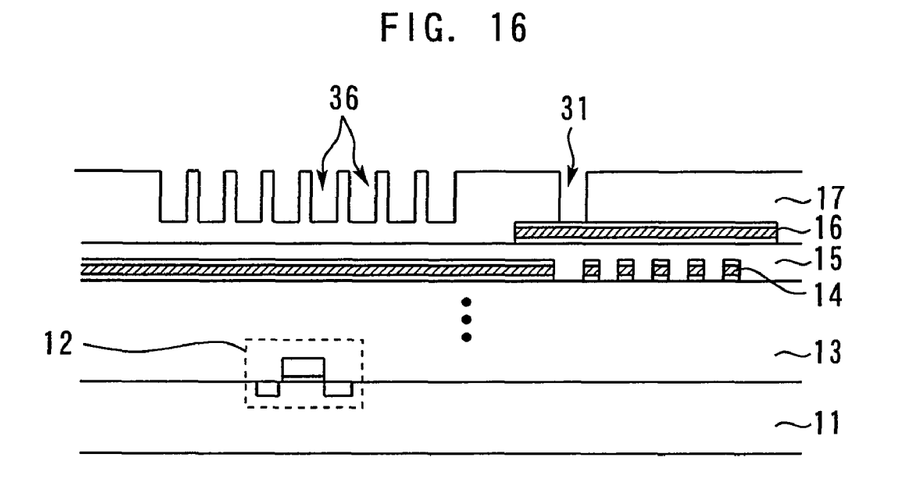
FIGS. 16-20 are sectional views for explaining a method of manufacturing a semiconductor device according to a third embodiment of the present invention.

First, as shown in FIG. 16, the active element 12, inter-layer insulating film 13, lower layer wiring 14, inter-layer insulating film 15 and lower layer wiring 16 are formed on the semiconductor substrate 11. Next, the inter-layer insulating film 17 is formed on the semiconductor substrate 11 so as to cover the lower layer wiring 16. The first contact hole 31 is then formed in the inter-layer insulating film 17 to expose part of the lower layer wiring 16. In this case, a plurality of second contact holes 36 are also formed in the inter-layer insulating film 17.

Figure 17:
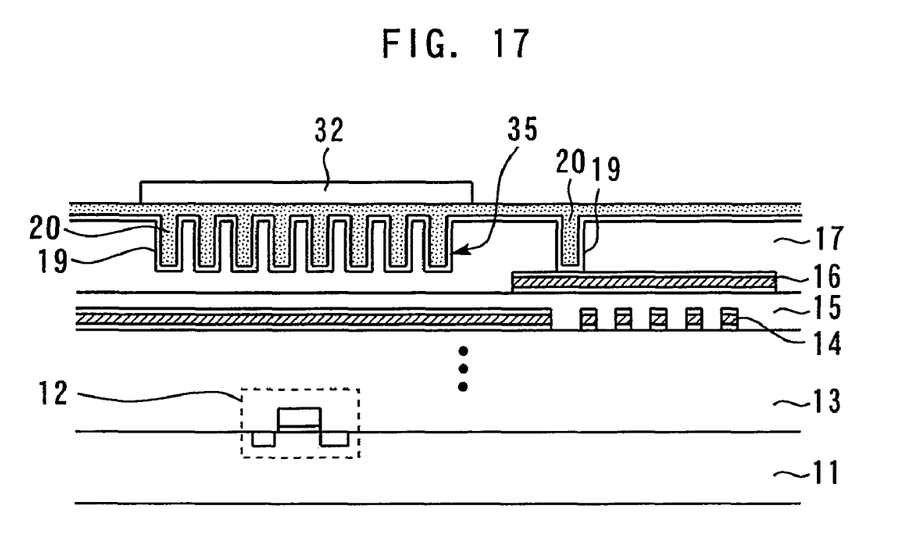

Next, as shown in FIG. 17, after the TiN barrier metal 19 is formed on the inter-layer insulating film 17 and in the first contact holes 31 and 36, the first metal film 20 is formed on the inter-layer insulating film 17 and in the first contact holes 31 and 36 through the TiN barrier metal 19. The first resist 32 is formed on the first metal film 20, the first resist 32 is patterned and the first resist 32 is removed from around the first contact hole 31 so that the first resist 32 remains on the plurality of metal plugs 35.

Figure 18:
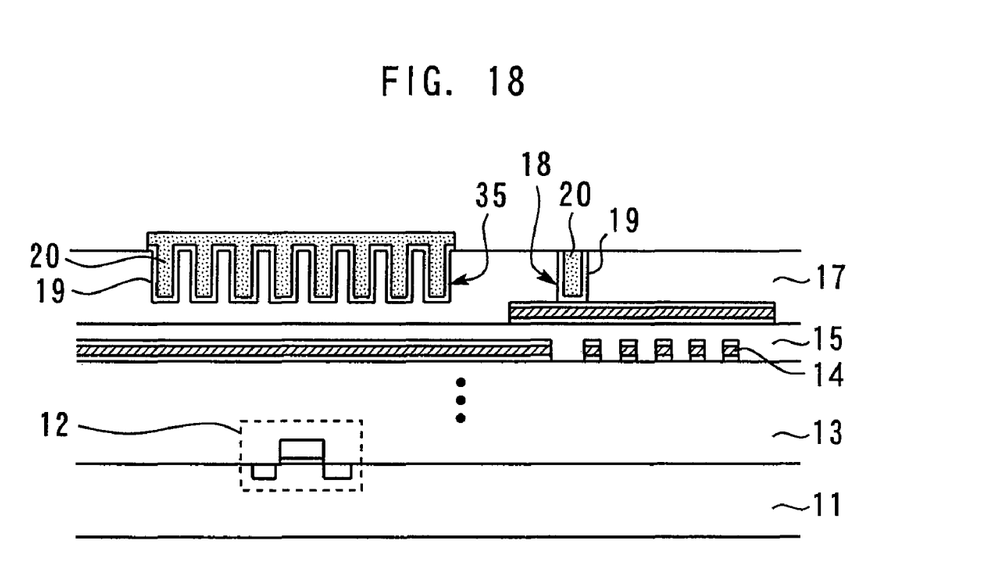

Next, as shown in FIG. 18, the first metal film 20 is subjected to anisotropic etching (dry etching) using the first resist 32 as a mask and the first metal film 20 and TiN barrier metal 19 on the inter-layer insulating film 17 are removed from around the first contact hole 31. However, the first metal film 20 and TiN barrier metal 19 are left as they are in the first contact hole 31. The first resist 32 is then removed.

Figure 19:
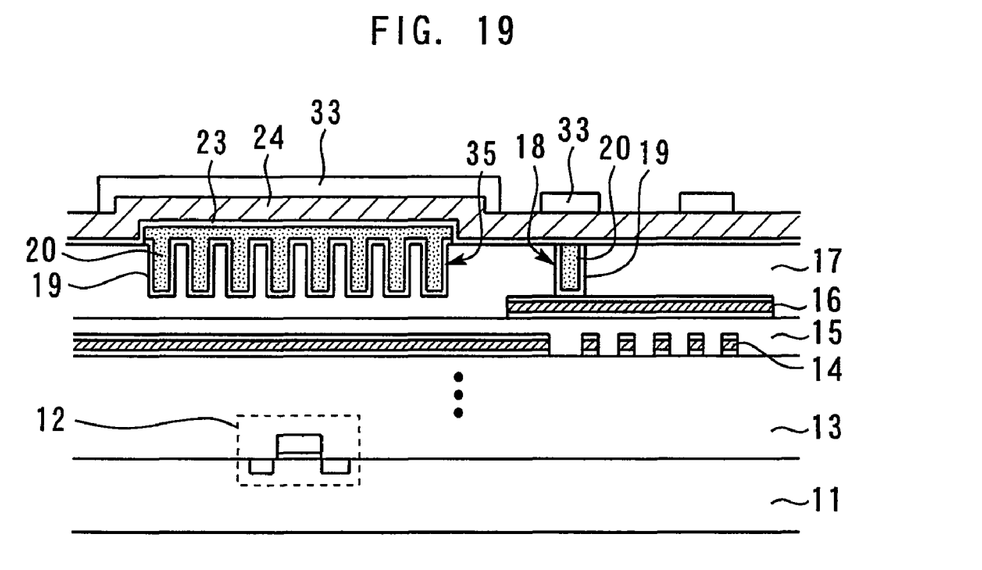

Next, as shown in FIG. 19, the second metal film 24 having lower Young's modulus than the first metal film 20 is formed on the inter-layer insulating film 17 so as to cover the remaining first metal film 20. Second resists 33 are then formed on the second metal film 24 in the area where the first metal film 20 exists on the inter-layer insulating film 17 and in the area where the first contact hole 31 exists, which is part of the area where the first metal film 20 does not exist. Here, the film thickness of the second resist 33 is set to 2 μm or less. Furthermore, the width of the second resist 33 formed on the first metal film 20 that exists on the inter-layer insulating film 17 is made greater than that of the first metal film 20.

Figure 20:
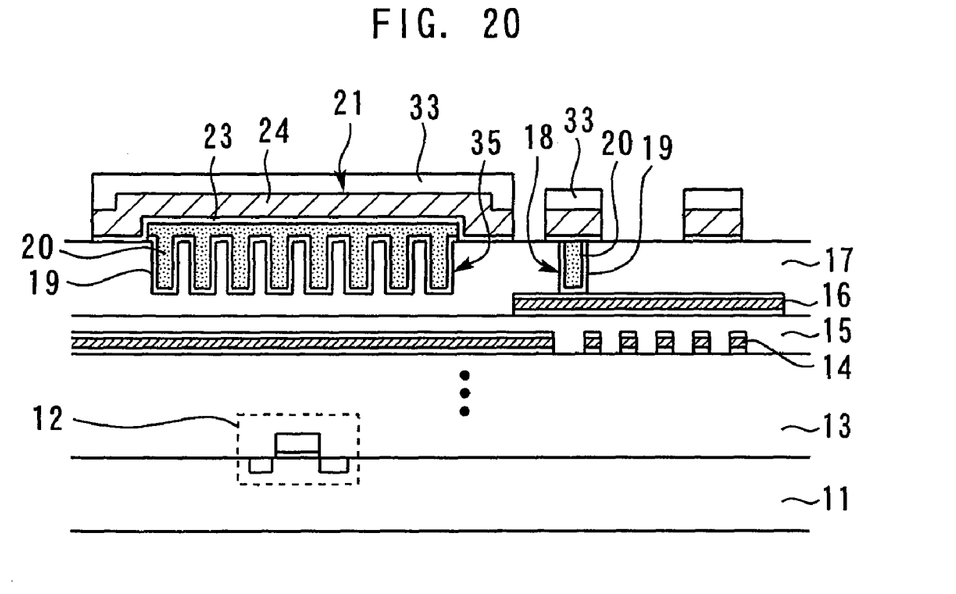

Next, as shown in FIG. 20, the second metal film 24 is subjected to anisotropic etching (dry etching) using the second resist 33 as a mask to form the bonding pad 21 having the first metal film 20 and second metal film 24, and the upper layer wiring 22 that has the second metal film 24, yet not the first metal film 20. Here, the bonding pad 21 is formed on the plurality of metal plugs 35. The second resist 33 is then removed.

Next, the surface protection film 25 is formed so as to cover the bonding pad 21. On the bonding pad 21, the pad opening 26 having a smaller width than that of the first metal film 20 of the bonding pad 21 is formed in the surface protection film 25. The semiconductor device according to this embodiment shown in FIG. 14 is formed through the above described processes.

As described above, when forming the first metal film 20 of the bonding pad 21 on the inter-layer insulating film 17, this embodiment embeds the first metal film 20 in the second contact holes 36 and forms the plurality of metal plugs 35. This can shorten processes and reduce cost.

Furthermore, since the plurality of metal plugs 35 are formed below the bonding pad 21, it is possible to increase average Young's modulus of the inter-layer insulating film 17 below the bonding pad 21 and thereby further improve resistance to impacts of probing and wire bonding.

Furthermore, this embodiment adopts the linear shape for each metal plug 35 whose longitudinal direction corresponds to the direction in which the plurality of bonding pads 21 are arrayed. This makes it easier to guide the direction of approach of the probe to a direction perpendicular to the longitudinal direction of the metal plugs 35, and can thereby further improve resistance to impacts of probing.

Fourth Embodiment

Figure 21:
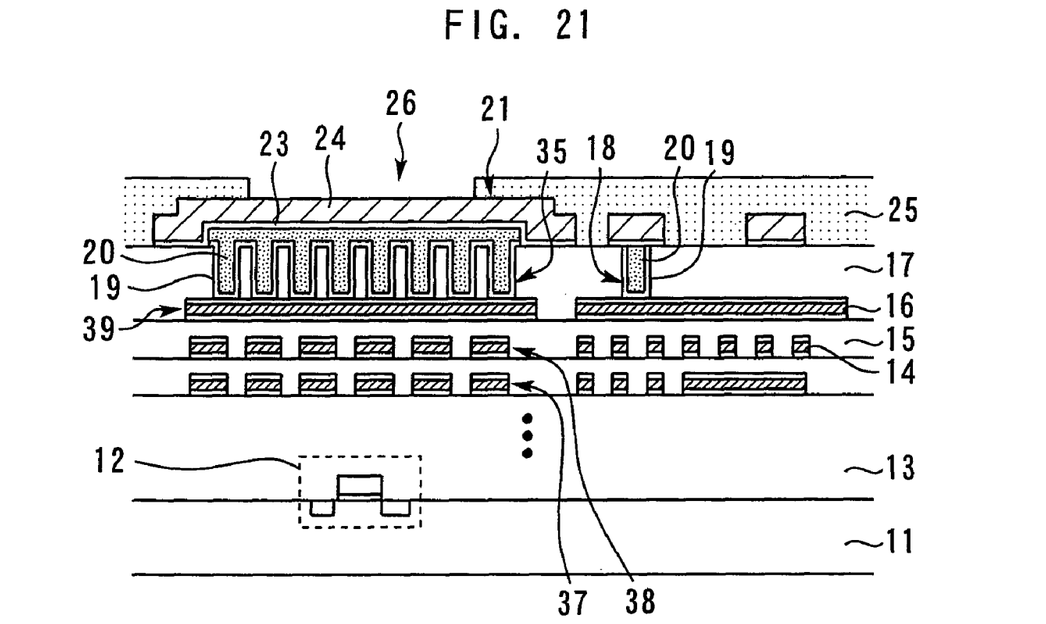
FIG. 21 is a cross-sectional view showing a semiconductor device according to a fourth embodiment of the present invention.

FIG. 21 is a cross-sectional view showing a semiconductor device according to a fourth embodiment of the present invention. There is a metal layer 39 connected below the metal plugs 35, and metal layers 37 and 38 which are divided into a plurality of portions are formed therebelow. Here, metal films such as Al—Cu, Al—Si—Cu or Cu, a metal of low Young's modulus, on and below which TiN barrier metals are formed are used as the metal layers 37 to 39. The rest of the configuration is the same as that in the third embodiment. The buffering effect of these metal layers 37 to 39 further improves resistance to impacts of probing and wire bonding.

Obviously many modifications and variations of the present invention are possible in the light of the above teachings. It is therefore to be understood that within the scope of the appended claims the invention may be practiced otherwise as specifically described.

The entire disclosure of a Japanese Patent Application No. 2007-191183, filed on Jul. 23, 2007 including specification, claims, drawings and summary, on which the Convention priority of the present application is based, are incorporated herein by reference in its entirety.

What is claimed is:

1. A method of manufacturing a semiconductor device comprising:
   a step of forming an inter-layer insulating film on a semiconductor substrate;
   a step of forming a first metal film on the inter-layer insulating film;
   a step of forming a first resist on the first metal film and patterning the first resist;
   a step of performing anisotropic etching on the first metal film using the first resist as a mask;
   a step of removing the first resist;
   a step of forming a second metal film on the inter-layer insulating film so as to cover the remaining first metal film;
   a step of forming a second resist on the second metal film in an area where the first metal film exists on the inter-layer insulating film and part of an area where the first metal film does not exist;
   a step of performing anisotropic etching on the second metal film using the second resist as a mask and forming a bonding pad having the first metal film and the second metal film and an upper layer wiring which has the second metal film, yet not the first metal film;

a step of removing the second resist;

a step of forming a surface protection film so as to cover the bonding pad; and a step of forming a pad opening in the surface protection film on the bonding pad.

2. A method of manufacturing a semiconductor device comprising:

a step of forming a lower layer wiring on a semiconductor substrate;

a step of forming an inter-layer insulating film on the semiconductor substrate so as to cover the lower layer wiring;

a step of forming a first contact hole in the inter-layer insulating film and exposing part of the lower layer wiring;

a step of forming a first metal film on the inter-layer insulating film and in the first contact hole;

a step of forming a first resist on the first metal film and removing the first resist from an area where at least the first contact hole exists;

a step of performing anisotropic etching on the first metal film using the first resist as a mask, leaving at least the first metal film in the first contact hole and removing the first metal film on the inter-layer insulating film;

a step of removing the first resist;

a step of forming a second metal film on the inter-layer insulating film so as to cover the remaining first metal film;

a step of forming a second resist on the second metal film in an area where the first metal film exists on the inter-layer insulating film and an area where the first contact hole exists;

a step of performing anisotropic etching on the second metal film using the second resist as a mask and forming a bonding pad having the first metal film and the second metal film and an upper layer wiring having the second metal film, yet not the first metal film;

a step of removing the second resist;

a step of forming a surface protection film so as to cover the bonding pad; and a step of forming a pad opening in the surface protection film on the bonding pad.

3. The method of manufacturing a semiconductor device according to claim 1, wherein the second metal film of the bonding pad is made wider than the first metal film of the bonding pad by at least the film thickness of the first metal film.

4. The method of manufacturing a semiconductor device according to claim 3, wherein the pad opening is made narrower than the first metal film of the bonding pad.

5. The method of manufacturing a semiconductor device according to claim 1, wherein the second metal film of the bonding pad is made narrower than the first metal film of the bonding pad.

6. The method of manufacturing a semiconductor device according to claim 5, wherein the pad opening is made narrower than the second metal film of the bonding pad.

7. The method of manufacturing a semiconductor device according to claim 1, further comprising a step of forming a plurality of second contact holes in the inter-layer insulating film, wherein when the first metal film is formed on the inter-layer insulating film, a plurality of metal plugs are formed by embedding the first metal film in the plurality of second contact holes, and the bonding pad is formed on the plurality of metal plugs.

8. The method of manufacturing a semiconductor device according to claim 7, wherein the plurality of bonding pads are arrayed in one direction, and a linear shape is adopted for each metal plug whose longitudinal direction corresponds to the direction in which the plurality of bonding pads are arrayed.

9. The method of manufacturing a semiconductor device according to claim 1, wherein the first metal film of the bonding pad is formed over the entire area where the pad opening of the surface protection film is formed.

10. The method of manufacturing a semiconductor device according to claim 1, wherein a low dielectric constant film is used as the inter-layer insulating film.

11. The method of manufacturing a semiconductor device according to claim 1, wherein an active element is formed below the bonding pad.

12. The method of manufacturing a semiconductor device according to claim 1, wherein the film thickness of the second resist is set to 2 µm or less.

13. The method of manufacturing a semiconductor device according to claim 1, further comprising a step of performing a test with a probe contacting the bonding pad.

14. The method of manufacturing a semiconductor device according to claim 1, further comprising a step of bonding a wire to the bonding pad.

15. The method of manufacturing a semiconductor device according to claim 1, wherein the first metal film has greater Young's modulus than the second metal film.

16. A semiconductor device comprising:

a semiconductor substrate;

an inter-layer insulating film formed on the semiconductor substrate;

a bonding pad formed on the inter-layer insulating film;

an upper layer wiring formed in the same layer as the bonding pad on the inter-layer insulating film; and a surface protection film formed so as to cover the bonding pad, in which a pad opening is formed on the bonding pad, wherein the bonding pad comprises a first metal film and a second metal film formed on the first metal film, the upper layer wiring comprises the second metal film, yet not the first metal film, and a first Young's modulus of the first metal film is higher than a second Young's modulus of the second metal film.

17. The semiconductor device according to claim 16, wherein the second metal film of the bonding pad has a greater width than that of the first metal film of the bonding pad by at least the film thickness of the first metal film.

18. The semiconductor device according to claim 17, wherein the pad opening is narrower than the first metal film of the bonding pad.

19. The semiconductor device according to claim 16, wherein the second metal film of the bonding pad is narrower than the first metal film of the bonding pad.

20. The semiconductor device according to claim 19, wherein the pad opening is narrower than the second metal film of the bonding pad.

21. The semiconductor device according to claim 16, further comprising a plurality of metal plugs formed below the bonding pad.

22. The semiconductor device according to claim 21, wherein a plurality of bonding pads are arrayed in one direction within a plane, and a linear shape is adopted for each metal plug whose longitudinal direction corresponds to the direction in which the plurality of bonding pads are arrayed.

23. The semiconductor device according to claim 16, wherein the first metal film of the bonding pad is formed over the entire area where the pad opening of the surface protection film is formed.

24. The semiconductor device according to claim 16, wherein the inter-layer insulating film is a low dielectric constant film.

25. The semiconductor device according to claim 16, further comprising an active element formed below the bonding pad.

26. A method of manufacturing the semiconductor device according to claim 16, wherein the first metal film has greater Young's modulus than the second metal film.

27. The semiconductor device according to claim 16, wherein a first upper surface of the bonding pad is higher than a second upper surface of the upper wiring layer.

28. The semiconductor device according to claim 27, wherein each of a first under surface of the bonding pad and a second under surface of the upper layer wiring is connected to the inter-layer insulating film.

29. The semiconductor device according to claim 16, wherein the first metal film is tungsten, and the second metal film is aluminum.

30. The semiconductor device according to claim 29, wherein a first barrier metal is formed between the first metal film and the inter-layer insulating film, and a second barrier metal is formed between the second metal film and the inter-layer insulating film.

* * * * *